United States Patent
Hirano et al.

(10) Patent No.: US 9,171,877 B2
(45) Date of Patent: Oct. 27, 2015

(54) SEMICONDUCTOR IMAGING DEVICE HAVING LIGTH TRANSMISSION LAYERS FORMED RELATIVE TO A GUARD RING STRUCTURE IN A PREDETERMINED MANNER

(75) Inventors: Hideki Hirano, Kanagawa (JP); Akiko Ogino, Kumamoto (JP); Kenju Nishikido, Kumamoto (JP); Iwao Sugiura, Kanagawa (JP); Haruhiko Ajisawa, Kanagawa (JP); Ikuo Yoshihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 719 days.

(21) Appl. No.: 12/634,338

(22) Filed: Dec. 9, 2009

(65) Prior Publication Data
US 2010/0155582 A1    Jun. 24, 2010

(30) Foreign Application Priority Data

Dec. 10, 2008   (JP) .................................. 2008-314510

(51) Int. Cl.
*H01L 27/146* (2006.01)
*H01L 29/06* (2006.01)

(52) U.S. Cl.
CPC ...... *H01L 27/14636* (2013.01); *H01L 29/0619* (2013.01); *H01L 29/0623* (2013.01); *Y10S 148/07* (2013.01)

(58) Field of Classification Search
USPC ............ 250/208.1, 214.1, 214 R, 216, 208.2, 250/231; 257/431, 432, 443, 45
See application file for complete search history.

(56) References Cited

U.S. PATENT DOCUMENTS

| | | | |
|---|---|---|---|
| 5,648,653 A * | 7/1997 | Sakamoto et al. | 250/208.1 |
| 7,939,913 B2 | 5/2011 | Watanabe et al. | |
| 2007/0001307 A1* | 1/2007 | Usui et al. | 257/758 |
| 2008/0122038 A1* | 5/2008 | Inohara | 257/620 |
| 2008/0135732 A1* | 6/2008 | Toumiya et al. | 250/208.1 |
| 2009/0267193 A1* | 10/2009 | Hayasaki | 257/620 |

FOREIGN PATENT DOCUMENTS

| | | |
|---|---|---|
| JP | 06-209094 | 7/1994 |
| JP | 08-186241 | 7/1996 |
| JP | 11-121725 | 4/1999 |
| JP | 2000-150845 | 5/2000 |
| JP | 2002-135523 | 5/2002 |
| JP | 2006-140404 | 6/2006 |
| JP | 2007-081038 | 3/2007 |
| JP | 2007-119744 | 5/2007 |
| JP | 2008-166677 | 7/2008 |

* cited by examiner

*Primary Examiner* — Francis M Legasse, Jr.
(74) *Attorney, Agent, or Firm* — Michael Best & Friedrich LLP

(57) ABSTRACT

A solid-state imaging device includes: a photodiode formed to be segmented with respect to each pixel in a pixel area in which plural pixels are integrated on a light receiving surface of a semiconductor substrate; an insulator film formed on the semiconductor substrate to cover the photodiode; a recessed part formed with respect to each of the pixels in the insulator film in an upper part of the photodiode; a first light transmission layer of a siloxane resin formed to fill the recessed part and configure an optical waveguide in the pixel area; a second light transmission layer formed to configure an on-chip lens with respect to each of the pixels in the pixel area; and a guard ring formed to surround an outer circumference of the pixel area to partition an inner area containing the pixel area and an outer dicing area.

13 Claims, 14 Drawing Sheets

SEMICONDUCTOR IMAGING DEVICE HAVING LIGTH TRANSMISSION LAYERS FORMED RELATIVE TO A GUARD RING STRUCTURE IN A PREDETERMINED MANNER

The present application claims priority to Japanese Patent Application JP 2008-314510 filed in the Japanese Patent Office on Dec. 10, 2008, the entire contents of which is hereby incorporated by reference.

BACKGROUND OF THE INVENTION

1. Field of the Invention

The present invention relates to a solid-state imaging device and a manufacturing method of the same, electronic equipment, and a semiconductor device, and specifically, to a solid-state imaging device in which pixels having photodiodes are arranged in a matrix on a light receiving surface and a manufacturing method of the same, electronic equipment including the solid-state imaging device, and a semiconductor device.

2. Background Art

In a solid-state imaging element represented by a CCD and a CMOS image sensor used for an area sensor, a photoelectric conversion part of photodiodes, a wiring part that transmits generated signals, transistors, etc. are formed on a semiconductor substrate. The element has a structure in which an on-chip lenses are formed on the photoelectric conversion part, and incident light is collected to the photoelectric conversion part by the on-chip lenses and photoelectrically converted.

Recently, in the solid-state imaging elements, demands for higher resolution and more pixels have been increasing. In the situation, to obtain higher resolution without increasing chip sizes, it is necessary to reduce the area per unit pixel for higher integration.

However, if the area per unit pixel is reduced, the amount of light entering the photodiode forming the photoelectric conversion part is not sufficient. Especially, in a CMOS image sensor, a distance from the on-chip lens to the photodiode region is longer due to its multilayer wiring structure. Accordingly, light entering obliquely does not reach the photodiode region but enters an adjacent photodiode, and not only reduction in sensitivity but also color mixing and lower resolution are caused.

In order to solve the problems, JP-A-11-121725 and JP-2000-150845 disclose a structure in which an optical waveguide formed by surrounding a core material with a high refractive index using a cladding material with a low refractive index between the photodiode and the on chip lens is provided.

To take an incidence angle as the optical waveguide, it is preferable to take a difference between refractive indices of the cladding material with the low refractive index and the core material with the high refractive index as large as possible. For example, a silicon oxide film with a refractive index of 1.5 or less is widely used for the cladding part (low-refractive-index part) of the optical waveguide structure formed on the photodiodes. On the other hand, for the core part (high-refractive-index part), an inorganic film of silicon nitride or diamond-like carbon (DLC) having a high refractive index, or an organic film of a siloxane resin or a polyimide resin is being studied. JP-2007-119744 and JP-2008-166677 disclose solid-state imaging devices using the above mentioned materials.

As an optical waveguide material, siloxane resin is being studied. The siloxane resin has a structure in which, to a skeleton of alternately bound silicon and oxygen, methyl groups and phenyl groups are bound as side chains. The siloxane resin has an extremely high filling characteristic for a minute hole, and may have both a high refractive index and heat resistance if a component that does not form a conjugated system but has aromaticity is introduced into the component of the siloxane.

As the optical waveguide material for coating, all materials that have refractive indices of 1.55 or more at a wavelength of 550 nm and are soluble in an organic solvent of γ-butyrolactone or cyclohexanone can be used. Further, by dispersing fine particle having a high refractive index and a size sufficiently smaller than that of visible light, for example, fine particles of zirconia or titania of 80 nm or less in siloxane, much higher refractive index can be reached without absorption of light.

When the siloxane resin is used as a material of the core part of the optical waveguide, the siloxane is formed on the entire surface of a wafer by coating. Accordingly, a dicing region (scribing part) is also covered by a siloxane film.

The subsequent steps will be explained with reference to the drawings.

For example, as shown in FIG. 15A, pixels are formed in a pixel area A1 of a semiconductor substrate 110 having a wafer shape. In each pixel, for example, a transistor including a photodiode 111, a diffusion layer 112, and the like, a multilayer insulating film 115 including an interlayer insulator film 113, a contact plug 114, and silicon oxide, a wiring layer 116 including copper, etc. are formed. The multilayer insulating film 115 is provided with a recessed part for optical waveguide 118, a protector film 117 of silicon nitride or the like is formed to cover the inner walls thereof, and a first light transmission layer 151 of siloxane resin or the like is formed to fill the region inside thereof. The first light transmission layer 151 forms a core part 151a with a high refractive index within the recessed part for optical waveguide 118. In the layer on the first light transmission layer 151, color filters 152 of blue (B), green (G) or red (R) are formed with respect to each pixel. In the layer on the color filters, on-chip lenses 153a are formed with respect to each pixel. The on-chip lenses 153a are formed by a light transmissive material, and a second light transmission layer 153 of the material is formed on the entire surface of the wafer. On the first light transmission layer, a transparent planarization layer that transmits light for improvement of adhesion to the color filters may be formed on the entire surface of the wafer.

In a logic area A2 of the semiconductor substrate 110, transistors including diffusion layers 121 and the like, multilayer insulating films 123 including contact plugs 122 and silicon oxide, wiring layers 124 including copper, etc. are formed. A protector film 117 is formed on the entire surface of them. In a pad area A3 of the semiconductor substrate 110, a pad electrode 131 is formed, and the protector film 117 is formed on the entire surface thereof. The protector film 117 in the part on the pad electrode 131 is removed for externally connectable configuration.

In a guard ring area A4 of the semiconductor substrate 110, a guard ring G as a structure including a multilayer insulating film 141, a conducting layer 142 having the same layers as those of the wiring layers 124 of copper or the like, a conducting layer 143 having the same layers as those of the pad electrode, etc. is formed. The guard ring G is provided at an end of one semiconductor chip. An area between two guard rings G is a dicing area A5. As described above, since the first light transmission layer 151 is formed on the entire wafer surface, the dicing area A5 is formed to be covered by the layer. Further, on the first light transmission layer 151, the second light transmission layer 153 as the on-chip lenses 153a in the pixel area A1 is stacked. In the configuration, in the pad area A3, a pad opening PO is formed to reach the pad electrode 131. At the following steps, as shown in FIG. 15B, dicing D is performed in the dicing area 5A using a dicing blade or the like to form separate pieces for each chip.

Here, in the siloxane resin, the main chain easily polarizes and shows polarity because silicon has lower electronegativity than oxygen. On the other hand, the methyl groups of the side chains are hard to polarize and shows non-polarity. Generally, the outer side of siloxane is covered by methyl groups having non-polarity and the like and shows water/oil repellency, and has poor adhesion to other materials. Further, when the siloxane film is heated and hardened for three-dimensional cross-linkage to increase its strength, the siloxane film becomes brittle. The siloxane in which inorganic nanoparticles are put for raising the refractive index is especially brittle, and a crack easily occurs. The siloxane film has low adhesion to the upper and lower films as described above, and is brittle and the crack easily progresses. Accordingly, when the siloxane film exists in the dicing area, as shown in FIG. 15B, a crack C occurs in the siloxane film due to mechanical stress and impact force of the dicing blade rotating at a high speed during dicing. Starting from the crack C, peeling easily occurs at the interface between the siloxane film and the upper film and the interface between the siloxane film and the lower film in poor adhesion. If the peeling of the films progresses from the scribing part to the pixel part, image quality becomes deteriorated.

Further, when chippings produced by dicing are attached onto the on-chip lenses in the pixel area, light does not reach the photodiodes in the part with the chippings thereon and the output signal level becomes lower, and these lead to deterioration in image quality. When the siloxane resin is used as the material of the core part of the optical waveguide as described above, peeling occurs at the interface between the siloxane and the upper layer or the lower layer during dicing and reaches the pixel area, chippings produced by dicing are attached to the pixel area, and thereby, deterioration in image quality and yield is caused.

SUMMARY OF THE INVENTION

The present inventors have recognized that, using a siloxane resin as a material of a core part of an optical waveguide causes deterioration in image quality and yield.

A solid-state imaging device according to an embodiment of the invention includes: a photodiode formed to be segmented with respect to each pixel in a pixel area in which plural pixels are integrated on a light receiving surface of a semiconductor substrate; an insulator film formed on the semiconductor substrate to cover the photodiode; a recessed part formed with respect to each of the pixels in the insulator film in an upper part of the photodiode; a first light transmission layer of a siloxane resin formed to fill the recessed part and configure an optical waveguide in the pixel area; a second light transmission layer formed to configure an on-chip lens with respect to each of the pixels in the pixel area; and a guard ring formed to surround an outer circumference of the pixel area to partition an inner area containing the pixel area and an outer dicing area, wherein the first light transmission layer and the second light transmission layer are also formed near the guard ring and in the dicing area so that a surface height of the first light transmission layer may be lower than that of the guard ring near the guard ring and in the dicing area and an interface between the first light transmission layer and the second light transmission layer may be in contact with the guard ring, and the device is diced within the dicing area.

Further, a solid-state imaging device according to another embodiment of the invention includes: a photodiode formed to be segmented with respect to each pixel in a pixel area in which plural pixels are integrated on a light receiving surface of a semiconductor substrate; an insulator film formed on the semiconductor substrate to cover the photodiode; a recessed part formed with respect to each of the pixels in the insulator film in an upper part of the photodiode; a first light transmission layer of a siloxane resin formed to fill the recessed part and configure an optical waveguide in the pixel area; a second light transmission layer formed to configure an on-chip lens with respect to each of the pixels in the pixel area; and a guard ring formed to surround an outer circumference of the pixel area to partition an inner area containing the pixel area and an outer dicing area, wherein the first light transmission layer is removed at least in a part of the dicing area and the device is diced in an area where the first light transmission layer has been removed.

A manufacturing method of a solid-state imaging device according to still another embodiment of the invention includes the steps of: forming a photodiode to be segmented with respect to each pixel in a pixel area in which plural pixels are integrated on a light receiving surface of a semiconductor substrate; forming an insulator film on the semiconductor substrate to cover the photodiode; forming a recessed part with respect to each of the pixels in the insulator film in an upper part of the photodiode; forming a first light transmission layer of a siloxane resin to fill the recessed part and configure an optical waveguide in the pixel area; forming a second light transmission layer to configure an on-chip lens with respect to each of the pixels in the pixel area; forming a guard ring to surround an outer circumference of the pixel area to partition an inner area containing the pixel area and an outer dicing area; and dicing the device within the dicing area, wherein, at the steps of forming the first light transmission layer and the second light transmission layer, the first light transmission layer and the second light transmission layer are also formed near the guard ring and in the dicing area so that a surface height of the first light transmission layer may be lower than that of the guard ring near the guard ring and in the dicing area and an interface between the first light transmission layer and the second light transmission layer may be in contact with the guard ring.

Further, a manufacturing method of a solid-state imaging device according to still another embodiment of the invention includes the steps of: forming a photodiode to be segmented with respect to each pixel in a pixel area in which plural pixels are integrated on a light receiving surface of a semiconductor substrate; forming an insulator film on the semiconductor substrate to cover the photodiode; forming a recessed part with respect to each of the pixels in the insulator film in an upper part of the photodiode; forming a first light transmission layer of a siloxane resin to fill the recessed part and configure an optical waveguide in the pixel area; forming a second light transmission layer to form an on-chip lens with respect to each of the pixels in the pixel area; forming a guard ring to surround an outer circumference of the pixel area to partition an inner area containing the pixel area and an outer dicing area; and dicing the device within the dicing area, wherein the step of forming the first light transmission layer includes the step of removing the first light transmission layer at least in a part of the dicing area, and, at the step of dicing, the device is diced in an area where the first light transmission layer has been removed.

Moreover, electronic equipment according to still another embodiment of the invention includes: a solid-state imaging device in which plural pixels are integrated on a light receiving surface; an optical system that guides incident light to an imaging part of the solid-state imaging device; and a signal processing circuit that processes an output signal of the solid-state imaging device, and the solid-state imaging device includes the above described configuration.

Further, a semiconductor device according to still another embodiment of the invention includes: a semiconductor substrate having an activated area; a resin layer containing a siloxane resin formed on the semiconductor substrate; and a guard ring formed to surround an outer circumference of the activated area to partition an inner area containing the activated area and an outer dicing area, wherein the resin layer is also formed near the guard ring and in the dicing area so that a surface height of the resin layer may be lower than that of the guard ring near the guard ring and in the dicing area, and the device is diced within the dicing area.

Furthermore, a semiconductor device according to still another embodiment of the invention includes: a semiconductor substrate having an activated area; a resin layer containing a siloxane resin formed on the semiconductor substrate; and a guard ring formed to surround an outer circumference of the activated area to partition an inner area containing the activated area and an outer dicing area, wherein the resin layer is removed at least in apart of the dicing area, and the device is diced in an area where the resin layer has been removed.

In the solid-state imaging device according to the embodiment of the invention, the interface between the first light transmission layer and the second light transmission layer is formed in contact with the guard ring, and therefore, even when a crack occurs, the crack stops at the guard ring, and deterioration in image quality and yield due to the crack can be reduced.

Further, in the solid-state imaging device of the embodiment according to the invention, the first light transmission layer is removed at least in a part of the dicing area, and no crack due to the first light transmission layer occurs at dicing and deterioration in image quality and yield due to the crack can be reduced.

In the manufacturing method according to a solid-state imaging device of the embodiment of the invention, the interface between the first light transmission layer and the second light transmission layer is formed in contact with the guard ring, and therefore, even when a crack occurs, the crack stops at the guard ring, and deterioration in image quality and yield due to the crack can be reduced.

Further, in the manufacturing method of a solid-state imaging device according to the embodiment of the invention, the first light transmission layer is removed at least in a part of the dicing area, and no crack due to the first light transmission layer occurs at dicing and deterioration in image quality and yield due to the crack can be reduced.

The electronic equipment according to the embodiment of the invention, in a solid-state imaging device forming the electronic equipment, deterioration in image quality and yield due to the crack can be reduced.

The semiconductor device according to the embodiment of the invention, in a semiconductor device having a layer of a siloxane resin, deterioration in image quality and yield due to the crack can be reduced.

DESCRIPTION OF PREFERRED EMBODIMENTS

As below, solid-state imaging devices, manufacturing methods of the devices, and electronic equipment including the solid-state imaging devices according to embodiments of the invention will be explained with reference to the drawings.

The explanation will be made in the following order.
1. First Embodiment (Configuration in which interface between first light transmission layer and second light transmission layer is contact with guard ring)
2. Second Embodiment (Configuration in which first light transmission layer is removed in part of dicing area and second light transmission layer is formed in removed part)
3. Third Embodiment (Configuration in which first light transmission layer and second light transmission layer are removed in part of dicing area)
4. Fourth Embodiment (Configuration in which first light transmission layer is removed in whole dicing area and second light transmission layer is formed in removed part)
5. Fifth Embodiment (Application to electronic equipment)

1. First Embodiment

Overall Configuration

Figure 1:
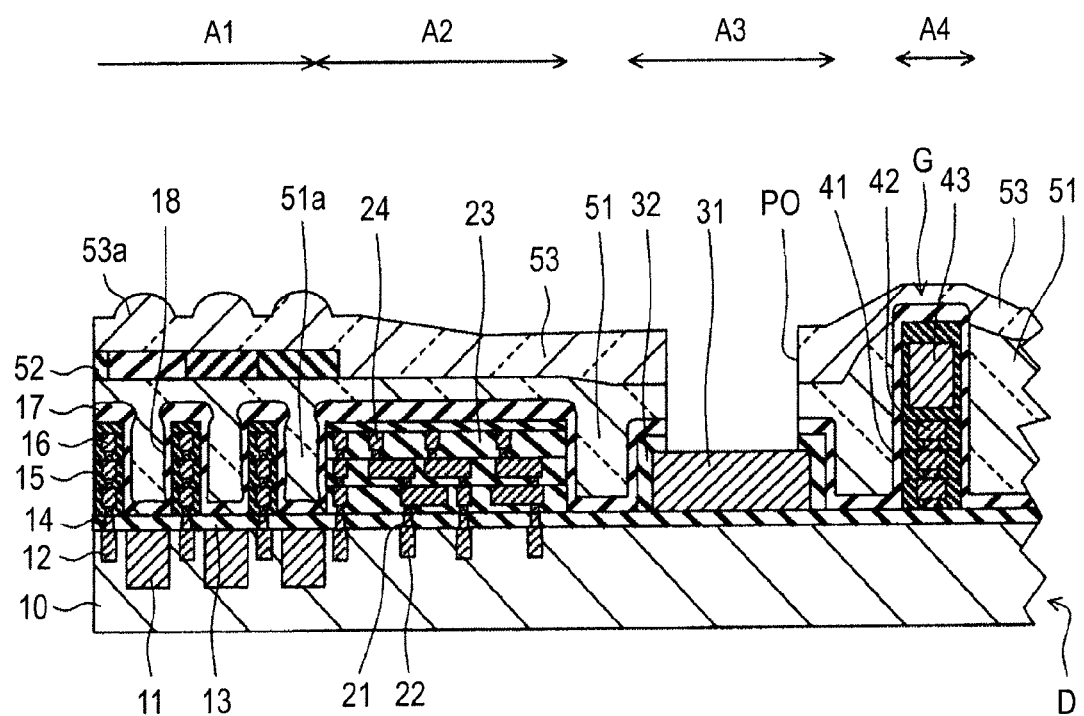
FIG. 1 is a schematic sectional view of a solid-state imaging device according to a first embodiment of the invention.

FIG. 1 is a schematic sectional view of a CMOS image sensor as a solid-state imaging device according to the embodiment.

In the drawing, a pixel area A1, a logic area A2, a pad area A3, and a guard ring area A4 are provided.

For example, plural pixels are integrated in the pixel area A1 of a semiconductor substrate 10 to form a light receiving surface.

Each pixel has a photodiode 11 formed to be segmented with respect to each pixel, for example. Further, in each pixel, a transistor including a diffusion layer 12 and the like, a multilayer insulating film 15 including an interlayer insulator film 13, a contact plug 14, silicon oxide, and the like, a wiring layer 16 including copper and the like, etc. are formed.

The multilayer insulating film 15 is provided with recessed parts for optical waveguide 18 in the part above the photodiodes with respect to each pixel, for example.

For example, a protector film 17 of silicon nitride or silicon carbide is formed to cover the inner walls of the recessed parts for optical waveguide 18. In the case of silicon nitride, for example, the film has a thickness of 400 nm, for example.

A first light transmission layer 51 of a siloxane resin or the like is formed to fill the recessed parts for optical waveguide 18 on the protector film 17.

The first light transmission layer 51 forms core parts 51a with a high refractive index within the recessed parts for optical waveguide 18.

As a siloxane resin forming the first light transmission layer 51, for example, a siloxane resin of poly(organosilsesquioxane) series may be used.

For example, glass resin 908F (product name, Techneglas, refractive index 1.57 (550 nm)) may be used.

In the layer on the first light transmission layer 51, color filters 52 of blue (B), green (G) or red (R) are formed with respect to each pixel.

In the layer on the color filters, for example, on-chip lenses 53a are formed with respect to each pixel.

The on-chip lenses 53a are formed by a light transmissive material, and a second light transmission layer 53 of the material is formed on the entire surface.

In the pixel area A1, when light information enters, electric signals are generated in the photodiodes.

The obtained electric signals are amplified by the transistors, and output to the logic area A2 via the wiring layer 16 and the like.

In the logic area A2 of the semiconductor substrate 10, transistors including the diffusion layers 21, multilayer insulating films 23 including contact plugs 22 and silicon oxide, wiring layers 24 including copper, etc. are formed.

A protector film 17 is formed on the entire surface of them.

The logic area A2 performs image processing of the electric signals input from the pixel area A1.

In the pixel area A1 and the logic area A2, for example, the wiring layers (16, 24) have three-layer configurations and they are respectively formed by the dual damascene process with copper, and, not limited to that, but the wiring layers may have single-layer configurations, for example.

In the pad area A3 of the semiconductor substrate 10, a pad electrode 31 is formed, and an insulator film 32 of silicon oxide or the like is formed on the upper layer.

The protector film 17 is formed on the entire surface thereof.

In the insulator film 32 and the protector film 17, a pad opening PO reaching the pad electrode 31 is opened as will be described later.

The pad electrode is formed by an aluminum alloy containing a small amount of copper, for example, in a film thickness of about 1 µm, for example.

The pad electrode 31 is connected to the logic area A2 using wiring (not shown), and outputs the image-processed electric signals to the outside.

In the guard ring area A4 of the semiconductor substrate 10, a guard ring G as a structure including a multilayer insulating film 41, a conducting layer 42 having the same layers as those of the wiring layers 24 of copper or the like, a conducting layer having the same layers as those of the pad electrode, etc. is formed.

The guard ring G has a height of about 1.5 µm and a width of about 20 µm, for example.

The guard ring G is provided at an end of a semiconductor chip to surround the outer circumferences of the pixel area A1, the logic area A2, and the pad area A3.

In the semiconductor wafer before dicing, an area between two guard rings G is a dicing area.

That is, the guard ring G is formed to partition the inner area including the pixel area and the outer dicing area.

The first light transmission layer 51 and the second light transmission layer 53 are also formed near the guard ring G and in the dicing area.

Here, near the guard ring G and in the dicing area, the surface height of the first light transmission layer 51 is lower than that of the guard ring G, and the interface between the first light transmission layer 51 and the second light transmission layer 53 is formed in contact with the guard ring G.

In the configuration, as shown by D in FIG. 1, separate pieces are formed by dicing in the dicing area.

Further, in the pad area A3, the pad opening PO is formed in the first light transmission layer 51 and the second light transmission layer 53 and the protector film 17 to reach the pad electrode 31.

In the solid-state imaging device of the embodiment, the interface between the first light transmission layer and the second light transmission layer is formed in contact with the guard ring, and therefore, even when a crack occurs at the interface between first light transmission layer and the second light transmission layer during dicing, the crack stops at the guard ring and does not propagate into the effective pixel part, and deterioration in image quality and yield due to the crack can be reduced.

In the pixel area, near the guard ring, and in the dicing area, a planarization layer that transmits light as a part of the first light transmission layer or the second light transmission layer may be formed at the interface between the first light transmission layer and the second light transmission layer.

Thereby, flatness and adhesion of the first light transmission layer and the second light transmission layer can be improved.

[Manufacturing Method]

Next, a manufacturing method of a solid-state imaging device according to the embodiment will be described.

Figure 2A:
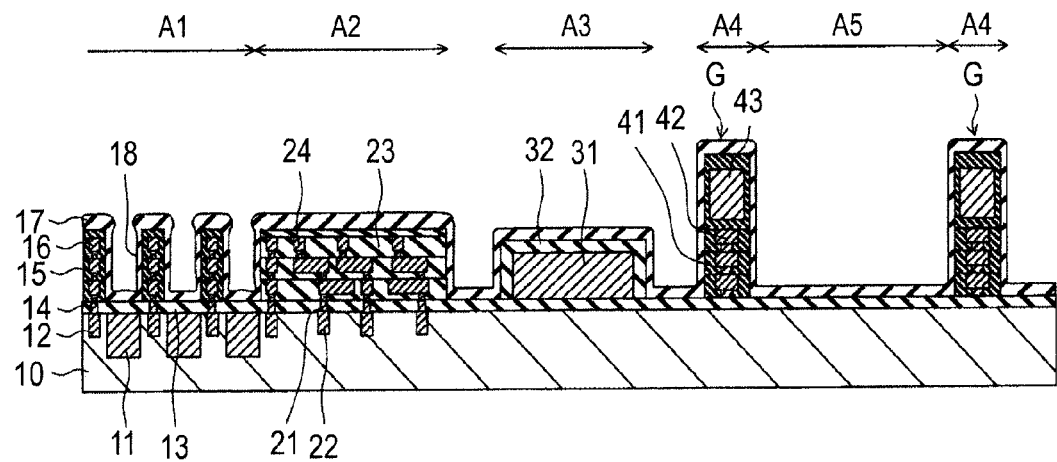
FIGS. 2A and 2B are schematic sectional views showing a manufacturing method of the solid-state imaging device according to the first embodiment of the invention.

First, a process to a configuration shown in FIG. 2A will be explained.

In the drawing, a pixel area A1, a logic area A2, a pad area A3, and guard ring areas A4 are shown, and an area between two guard ring areas A4 is a dicing area A5.

Under the condition of a wafer before dicing in the dicing area, the following process is performed.

In the pixel area A1 of the semiconductor substrate 10, plural pixels having the above configurations are integrated to form a light receiving surface.

Here, for example, on the semiconductor substrate, a transistor including a photodiode 11, a diffusion layer 12, and the like is formed, and an interlayer insulator film 13 and a multilayer insulating film 15 are further stacked, and a contact plug 14, a wiring layer 16 etc. are formed to be embedded within.

Then, a photoresist is applied and exposed to light and developed to open the part above the photodiode 11, etching is performed using it as a mask, and recessed parts for optical waveguide 18 are formed.

Further, in the logic area A2, the transistors and wiring layers having the above configurations are formed.

The transistors and wiring layers may be formed at the same time or in the same process as that of the pixel area A1.

In the pad area A3, a pad electrode 31 connecting to the logic area is formed.

In the guard ring area A4, as described above, a guard ring G is formed by a multilayer insulating film 41, a conducting layer 42 having the same layers as those of the wiring layers 24 of copper or the like, a conducting layer 43 having the same layers as those of the pad electrode, etc.

For example, a structure in a shape having predetermined height and width is formed to surround the pixel area A1, the logic area A2, and the pad area A3, and used as a guard ring G.

For example, the height of the guard ring G is about 1.5 μm, the width is about 20 μm, and the width of the dicing area A5 is about 100 μm.

After the formation in the respective areas, silicon nitride or silicon carbide is deposited to cover the inner walls of the recessed parts for optical waveguide 18 by CVD (chemical vapor deposition), for example, to form a protector film 17.

The protector film 17 is formed on the entire surface to cover a multilayer insulating film 23 of the logic area A2, an insulator film 32 of the pad area A3, the multilayer insulating films 41 of the guard ring areas A4, and the dicing area A5.

Figure 2B:
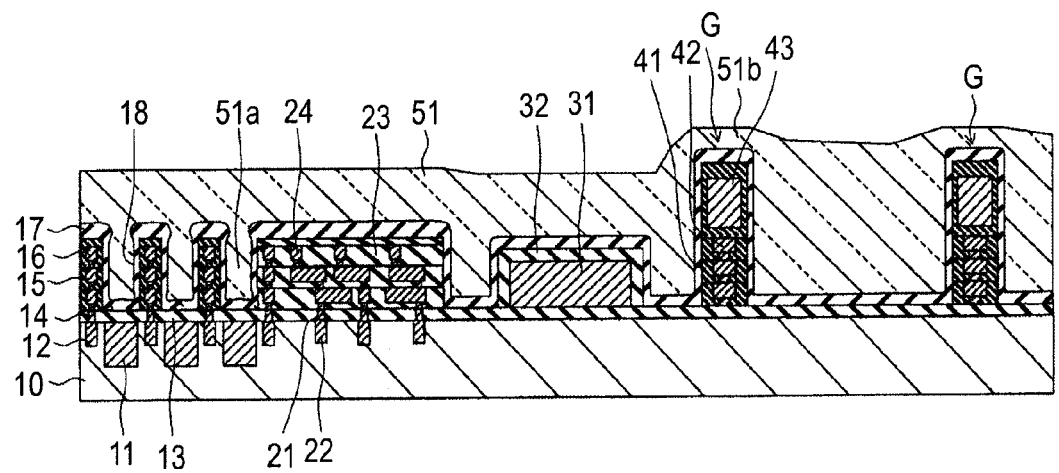

Then, as shown in FIG. 2B, for example, a first light transmission layer 51 of a siloxane resin or the like is formed on the protector film 17 to fill the recessed parts for optical waveguide 18.

For example, as a siloxane resin, a coating material formed by dissolving glass resin 908F (product name, Techneglas, refractive index 1.57 (550 nm)), which is an organosilsesquioxane type siloxane resin, in γ-butyrolactone at 15% is used.

The coating material is applied by spin coating and baked at 300° C. for sufficient volatilization of the solvent, and thereby, the first light transmission layer 51 is formed.

In the process, the first light transmission layer 51 is formed on the entire surface including the pixel area A1.

For example, the thickness of the first light transmission layer 51 of siloxane on the wiring of the pixel part after baking is about 320 nm.

Since the guard ring is protrudingly higher than the surrounding part, the thickness of the first light transmission layer 51*b* on the guard ring G is as thin as 90 nm because of the leveling effect due to the surface tension of the siloxane coating material.

In practice, a structure of alignment mark and the like may be provided in a part of the dicing area A5, however, these structures are lower than the guard ring G and have no influence on the thickness distribution after filling of siloxane.

Figure 3A:
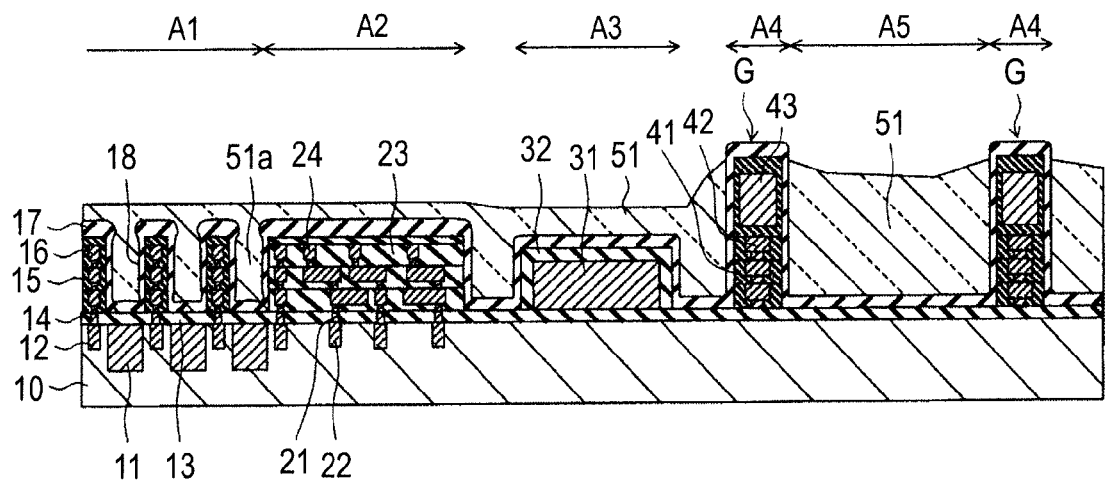
FIGS. 3A and 3B are schematic sectional views showing the manufacturing method of the solid-state imaging device according to the first embodiment of the invention.

Then, as shown in FIG. 3A, the first light transmission layer 51 is removed from the surface and lowered so that the surface height of the first light transmission layer 51 may be lower than that of the guard ring G.

Here, For example, the removing is performed by CCP dry-etching.

Conditions are as follows. $CF_4$ and $O_2$ are respectively flown at 150 SCCM and 50 SCCM, respectively, 50 mT and $CF_4/O_2$ plasma treatment is performed on the entire surface of the wafer for 60 seconds with the top power and bottom power of 1000 W and 500 W, respectively.

Thereby, for example, the first light transmission layer 51 is removed by etching uniformly on the upper surface by 150 nm.

In the pixel area A1, in the part other than the optical waveguides, the thickness of the first light transmission layer 51 is 170 nm.

Further, the siloxane resins on the guard rings G are completely etched and the protector film 17 is exposed.

Figure 3B:
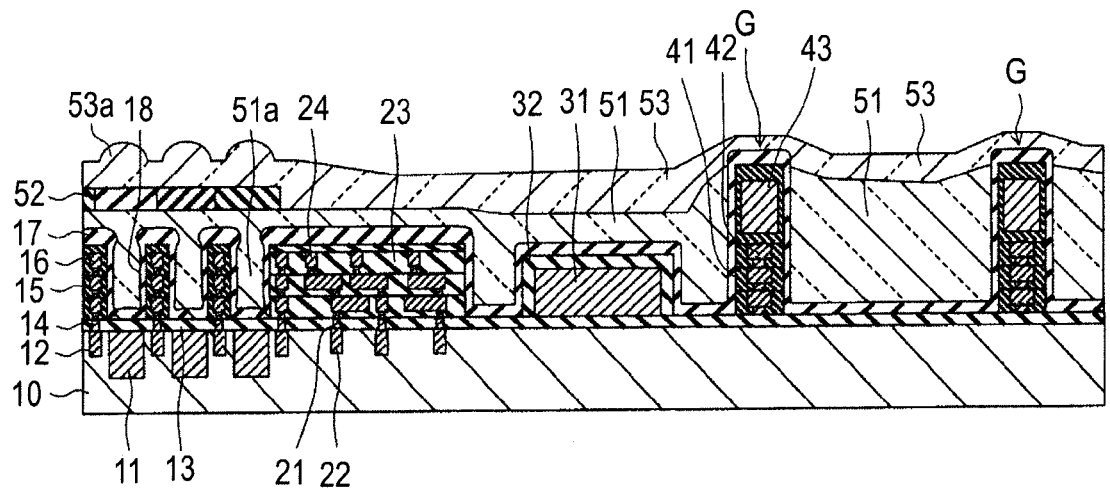

Then, as shown in FIG. 3B, for example, in the layer on the first light transmission layer 51, color filters 52 of blue (B), green (G) or red (R) are formed in a matrix with respect to each pixel.

A combination of yellow, magenta, and cyan may be used.

Then, for example, a second light transmission layer 53 of a non-photosensitive styrene resin having a high refractive indeed is formed by coating.

An i-ray photoresist is applied thereon, and a circular pattern is exposed to light and developed on the respective pixels.

Then, for example, heat at 200° C. is applied for reflowing the circular resist pattern, and thereby, a spherical on-chip lens pattern is formed.

The pattern is transferred to the styrene resin by etching back at a constant speed, and thereby, on-chip lenses 53*a* are formed.

Through the above process, the second light transmission layer 53 is formed on the entire surface including the pixel area A1.

An acrylic thermosetting resin for better flatness and adhesion may be sandwiched between the first light transmission layer 51 and the second light transmission layer 53.

Especially, as a planarization layer for improving the flatness, it is preferable that a layer that transmits light as part of the first light transmission layer and the second light transmission layer is formed at the interface between the first light transmission layer 51 and the second light transmission layer in the pixel area, near the guard ring, and in the dicing area.

Here, near the guard ring G and in the dicing area, the surface height of the first light transmission layer 51 is lower than that of the guard ring G, and the interface between the first light transmission layer 51 and the second light transmission layer 53 is formed in contact with the guard ring G.

The first light transmission layer 51 is removed from the surface and lowered so that the surface height of the first light transmission layer 51 may be lower than that of the guard ring G as described above.

Figure 4A:
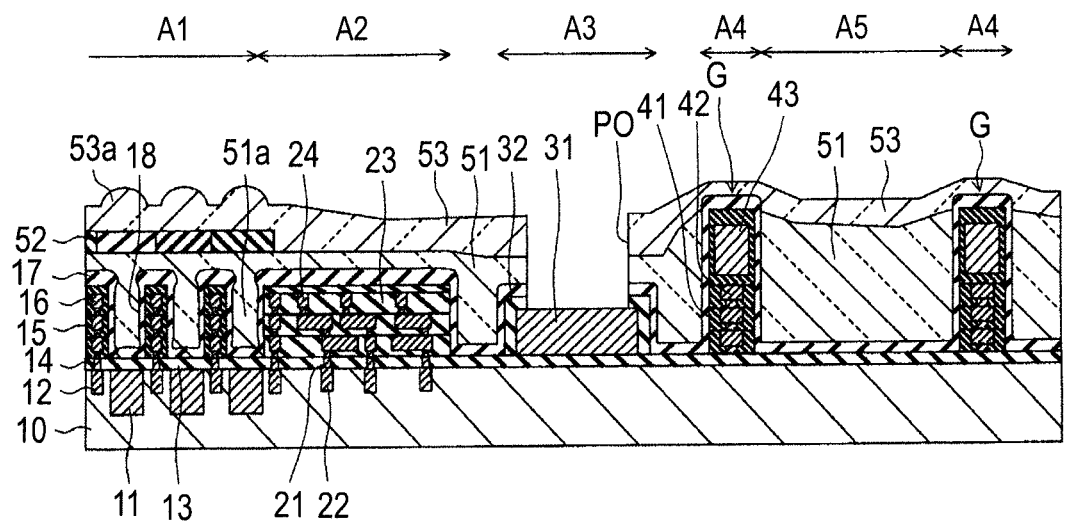
FIGS. 4A and 4B are schematic sectional views showing the manufacturing method of the solid-state imaging device according to the first embodiment of the invention.

Then, as shown in FIG. 4A, for example, a photoresist is applied on the second light transmission layer 53, and patterning is performed to open the pad area.

Using the obtained photoresist as a mask, the second light transmission layer 53, the first light transmission layer 51, and the protector film 17 and the insulator film 32 are removed by etching to form a pad opening PO.

Figure 4B:
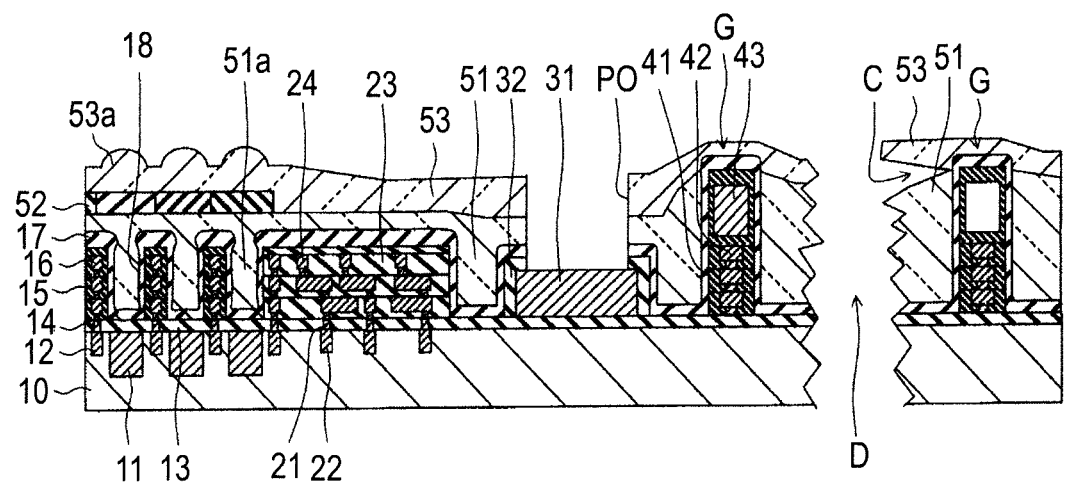

Then, as shown in FIG. 4B, for example, the rear surface of the semiconductor substrate 10 is ground by 400 nm so that the substrate may be worked to be thinner, and dicing D is performed using a dicing blade or the like in the dicing area A5 and separate pieces are formed for each chip.

For example, dicing is performed using a dicing blade having a width of 50 μm at 45000 rpm with 1.5 L of cutting cleaning water per minute in the dicing area A5.

A crack may occur between the siloxane film and the on-chip lens layer in poor adhesion due to mechanical stress of the dicing blade.

However, in the embodiment, the interface between the first light transmission layer and the second light transmission layer is formed in contact with the guard ring, and, even when a crack occurs between the first light transmission layer and the second light transmission layer, it stops at the guard ring. Accordingly, deterioration in image quality and yield due to propagation of the crack into the effective pixel part can be reduced.

If the film including the first light transmission layer is peeled in the dicing area, the peeled area becomes 100 µm or less as a width of the dicing area. Further, the amount of chippings produced at dicing is small and most of them are cleaned by the cutting cleaning water.

Accordingly, attachment of the chippings produced by dicing onto the on-chip lenses in the pixel area is reduced.

As described above, attachment of the chippings to the pixel area is suppressed, peeling at the interface of the first light transmission layer is suppressed, and thereby, image quality deterioration can be suppressed and yield deterioration can be suppressed to about 0.5%.

Second Embodiment

Overall Configuration

Figure 5:
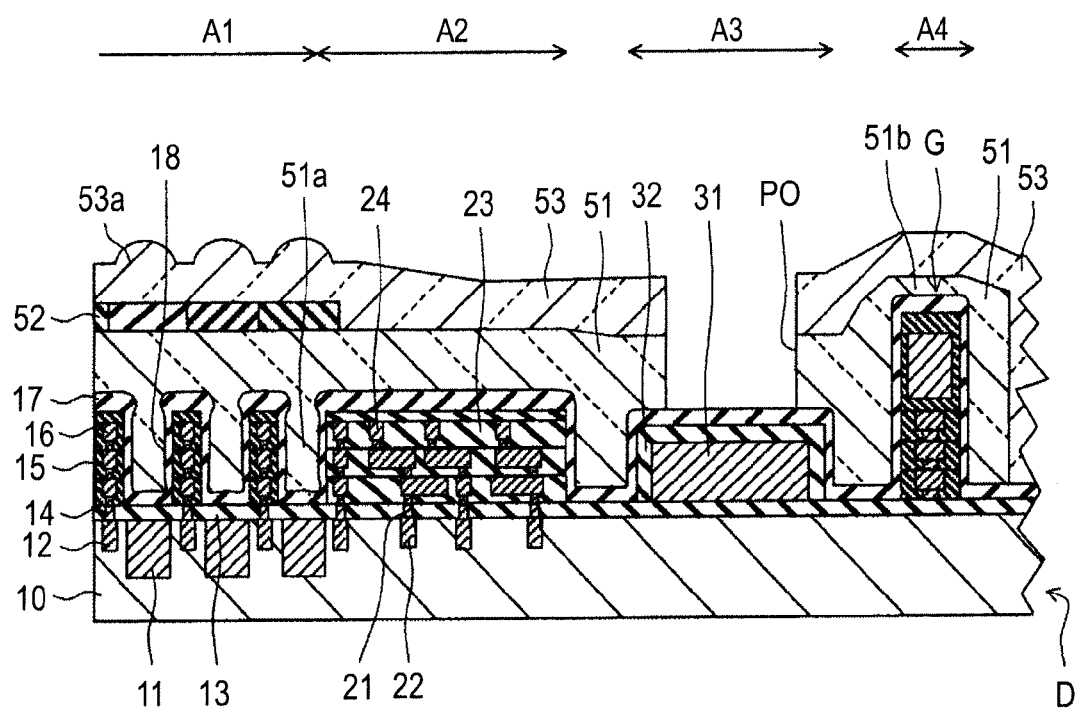
FIG. 5 is a schematic sectional view of a solid-state imaging device according to a second embodiment of the invention.

FIG. 5 is a schematic sectional view of a CMOS image sensor as a solid-state imaging device according to the embodiment.

In a part of the dicing area A5 (near the center at which dicing is actually performed), the first light transmission layer 51 is removed and the second light transmission layer 53 is formed in the area where the first light transmission layer 51 has been removed.

Dicing is performed to cut the second light transmission layer 53 in the area where the first light transmission layer 51 has been removed.

Except the points, the embodiment has substantially the same configuration as that of the first embodiment.

In the solid-state imaging device of the embodiment, the first light transmission layer has been removed in the part of the dicing area, no crack due to the first light transmission layer occurs in the dicing, and thereby, deterioration in image quality and yield due to the crack can be reduced.

[Manufacturing Method]

Next, a manufacturing method of a solid-state imaging device according to the embodiment will be described.

First, a configuration is formed in the same manner as that in the first embodiment to the configuration shown in FIG. 2B of the first embodiment.

Figure 6A:
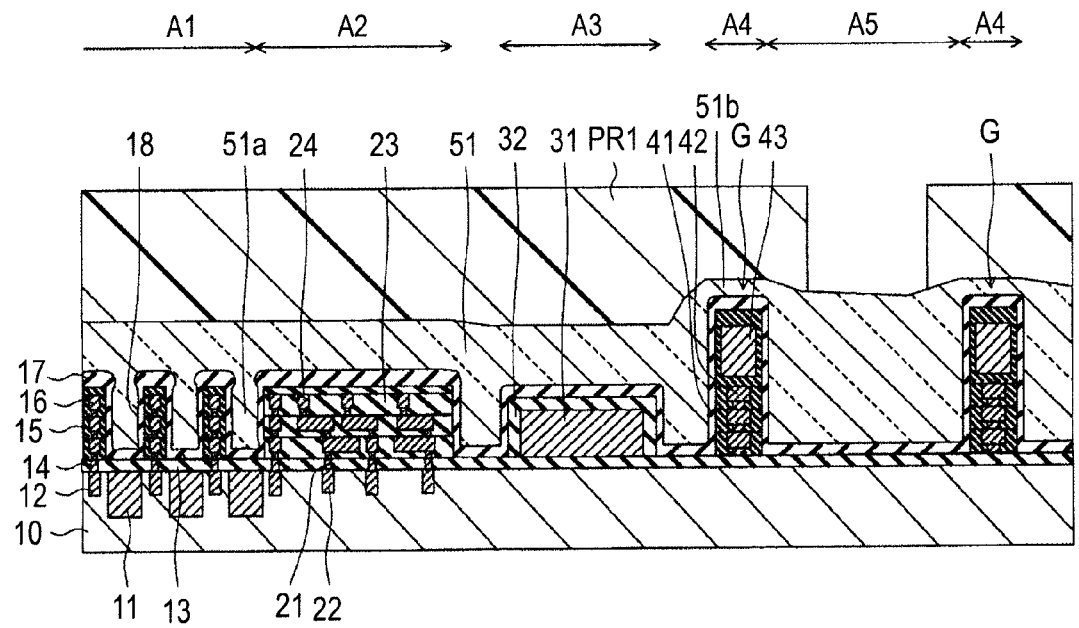
FIGS. 6A and 6B are schematic sectional views showing a manufacturing method of the solid-state imaging device according to the second embodiment of the invention.

Then, as shown in FIG. 6A, for example, a photoresist film PR1 is applied and exposed to light and developed to cover the part other than the part that the dicing blade actually cuts in the dicing area A5.

Figure 6B:
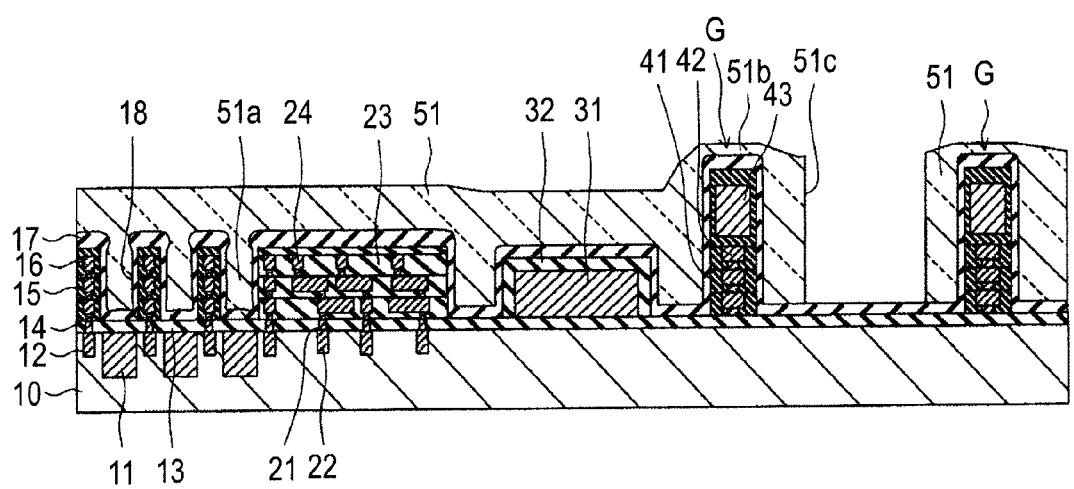

Then, as shown in FIG. 6B, for example, with the photoresist film PR1 as a mask, the first light transmission layer 51 in the dicing area A5 is selectively removed by treatment for 120 seconds at room temperature using a 5%-hydrofluoric acid solution.

The selection ratio of the silicon nitride film to siloxane with 5%-hydrofluoric acid is 12:1, and the protector film 17 is lowered to 80 nm at the maximum. The photoresist film PR1 is completely removed by an organic separating liquid after the first light transmission layer 51 is removed.

Figure 7A:
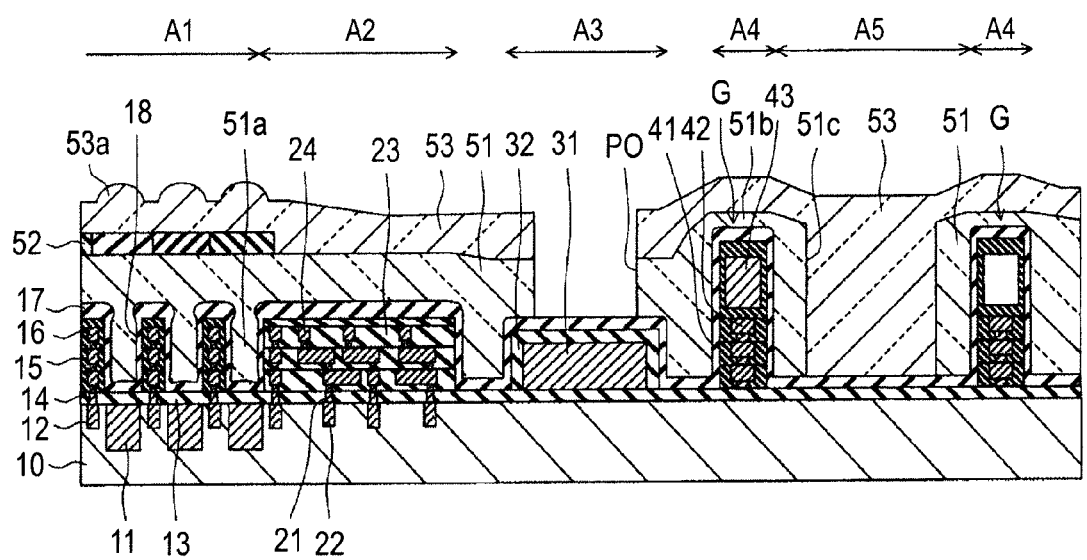
FIGS. 7A and 7B are schematic sectional views showing the manufacturing method of the solid-state imaging device according to the second embodiment of the invention.

Then, as shown in FIG. 7A, for example, in the layer on the first light transmission layer 51, color filters 52 of blue (B), green (G) or red (R) are formed in a matrix with respect to each pixel.

Then, for example, the second light transmission layer 53 including on-chip lenses 53a is formed.

Here, the second light transmission layer 53 is also formed in the area where the first light transmission layer 51 has been removed.

Furthermore, the pad opening PO is formed as is the case of the first embodiment.

Figure 7B:
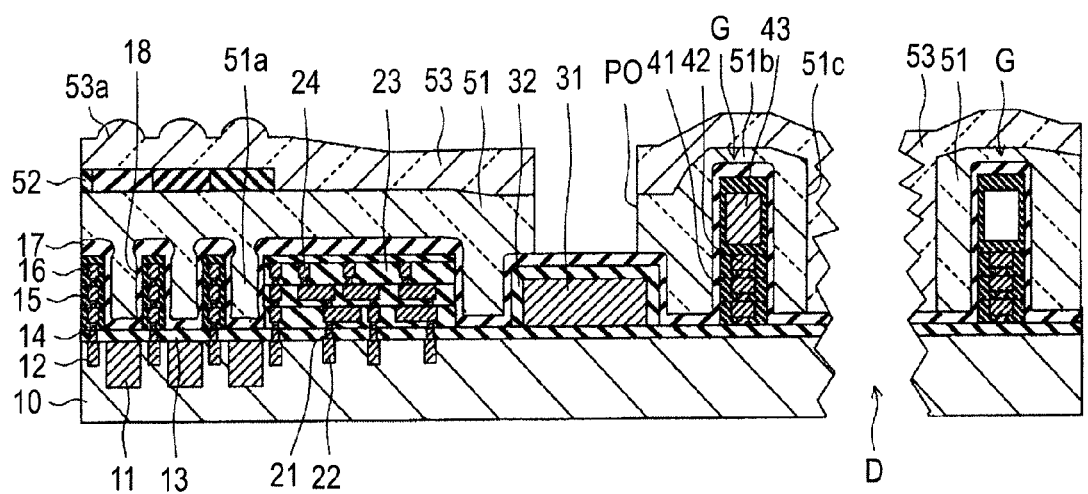

Then, as shown in FIG. 7B, for example, the rear surface of the semiconductor substrate 10 is ground by 400 nm so that the substrate may be worked to be thinner, and dicing D is performed using a dicing blade or the like in the dicing area A5 and separate pieces are formed for each chip.

For example, dicing is performed using a dicing blade having a width of 50 µm at 45000 rpm with 1.5 L of cutting cleaning water per minute in the dicing area A5.

In the embodiment, the second light transmission layer 53 is also formed in the area where the first light transmission layer 51 has been removed in the dicing area A5, and the second light transmission layer 53 is cut at the step of dicing.

In the embodiment, the first light transmission layer 51 has been removed in the dicing area A5, and peeling due to mechanical stress of the dicing blade can be suppressed.

Further, since there is no first light transmission layer 51 in the dicing area A5, the amount of chippings produced at dicing is small and most of them are cleaned by the cutting cleaning water.

Accordingly, attachment of the chippings produced by dicing onto the on-chip lenses in the pixel area is reduced.

As described above, attachment of the chippings to the pixel area is suppressed, peeling at the interface of the first light transmission layer is suppressed, and thereby, image quality deterioration can be suppressed and yield deterioration can be suppressed to about 0.1%.

Third Embodiment

Overall Configuration

Figure 8:
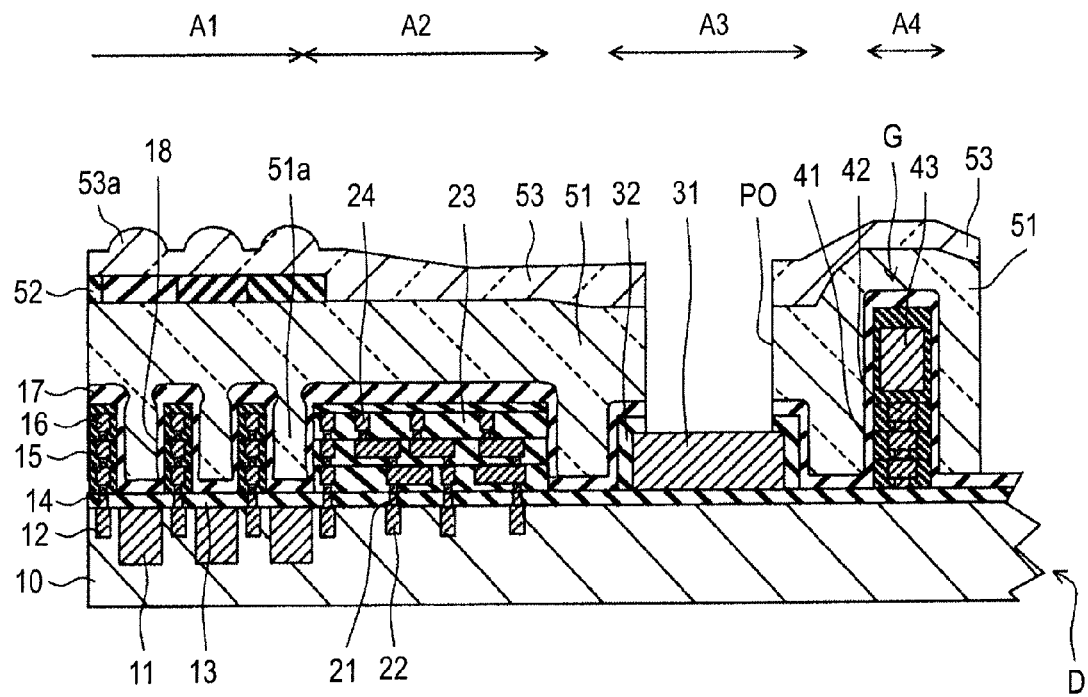
FIG. 8 is a schematic sectional view of a solid-state imaging device according to a third embodiment of the invention.

FIG. 8 is a schematic sectional view of a CMOS image sensor as a solid-state imaging device according to the embodiment.

In a part of the dicing area A5 (near the center at which dicing is actually performed), the first light transmission layer 51 and the second light transmission layer 53 are removed.

Dicing is performed in the area where the first light transmission layer 51 and the second light transmission layer 53 have been removed.

Except the points, the embodiment has substantially the same configuration as that of the first embodiment.

In the solid-state imaging device of the embodiment, the first light transmission layer has been removed in the part of the dicing area, no crack due to the first light transmission layer occurs in the dicing, and thereby, deterioration in image quality and yield due to the crack can be reduced.

[Manufacturing Method]

A manufacturing method of a solid-state imaging device according to the embodiment will be described.

First, a configuration is formed in the same manner as that in the first embodiment to the configuration shown in FIG. 2B of the first embodiment.

Then, for example, in the layer on the first light transmission layer 51, color filters 52 of blue (B), green (G) or red (R) are formed in a matrix with respect to each pixel.

Then, for example, the second light transmission layer 53 including on-chip lenses 53a is formed.

Figure 9A:
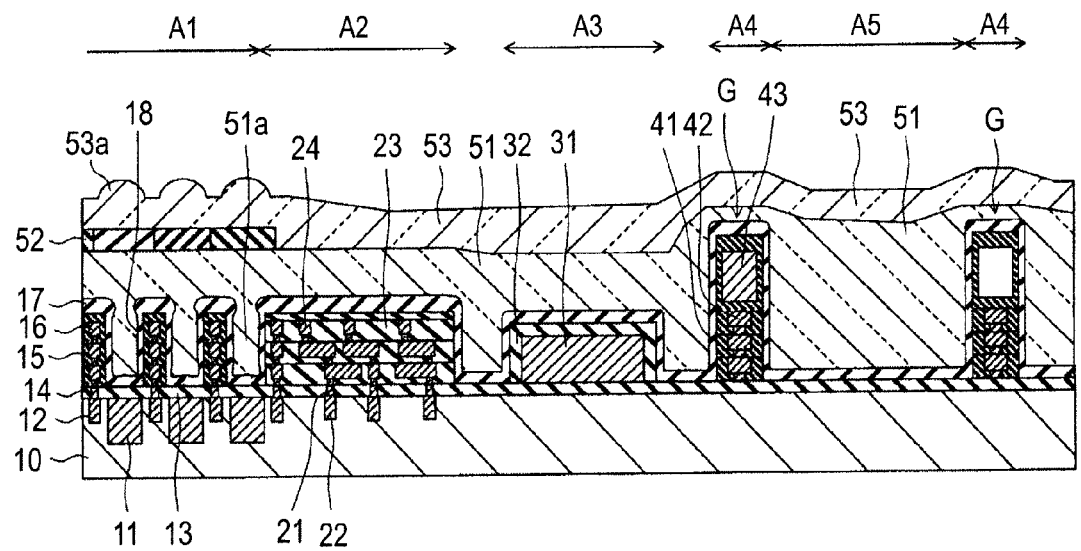
FIGS. 9A and 9B are schematic sectional views showing a manufacturing method of the solid-state imaging device according to the third embodiment of the invention.

In this way, the configuration shown in FIG. 9A is formed.

Figure 9B:
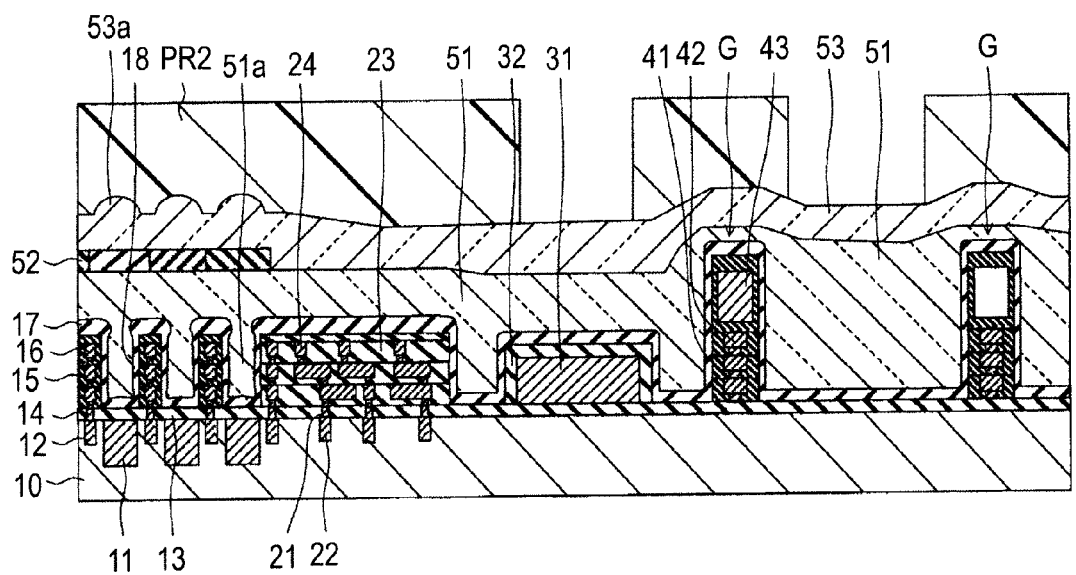

Then, as shown in FIG. 9B, for example, a photoresist film PR2 is applied and exposed to light and developed to cover the pad opening and the part other than the part that the dicing blade actually cuts in the dicing area A5.

Figure 10A:
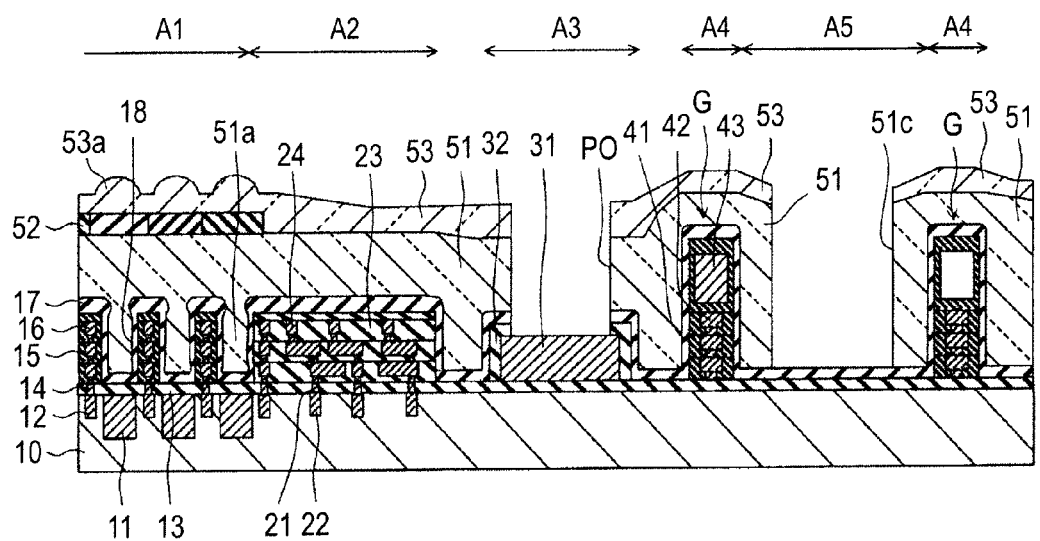
FIGS. 10A and 10B are schematic sectional views showing the manufacturing method of the solid-state imaging device according to the third embodiment of the invention.

Then, as shown in FIG. 10A, for example, with the photoresist film PR2 as a mask, the first light transmission layer 51 and the second light transmission layer 53 are removed by etching, and an opening 51c is formed in the dicing area A5.

In the pad area A3, the protector film 17 and the insulator film 32 are further removed by etching, and the pad opening PO is formed.

Here, the condition for removal by etching of the second light transmission layer 53 and the first light transmission layer 51 may be the same as that of the first embodiment.

Note that, as an alignment mark and an electric evaluation pattern provided on the scribing area, a copper pattern may be used. In this case, when the second light transmission layer 53 and the first light transmission layer 51 are removed by dry-etching, a part of the protector layer 17 is also etched, and the copper wiring pattern on the scribing part is exposed and there is a danger that the copper may contaminate the device.

In order to avoid the danger, the exposure of the copper pattern can be prevented by covering the copper wiring in the scribing part with an aluminum layer for formation of the pad and stopping the dry-etching in the aluminum layer.

Alternatively, the exposure of the copper pattern can be prevented by covering the copper wiring in the scribing area with the photoresist film PR2.

In these cases, the siloxane layer is left in the part of the scribing area. In order to prevent the crack propagating the interface between the siloxane layer and the area, an area in which the siloxane layer has been removed is provided between the position where the dicing blade passes and the device main body of the pixel part, the logic part, and the like.

Figure 10B:
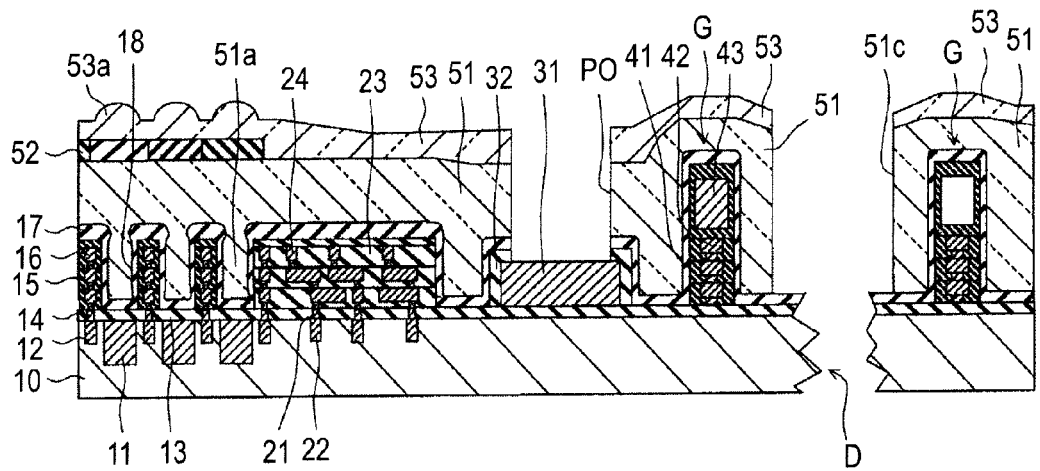

Then, as shown in FIG. 10B, for example, the rear surface of the semiconductor substrate 10 is ground by 400 nm so that the substrate may be worked to be thinner, and dicing D is performed using a dicing blade or the like in the dicing area A5 and separate pieces are formed for each chip.

For example, dicing is performed using a dicing blade having a width of 50 μm at 45000 rpm with 1.5 L of cutting cleaning water per minute in the dicing area A5.

In the embodiment, dicing is performed in the area where the first light transmission layer 51 and the second light transmission layer 53 have been removed at the step of dicing.

In the embodiment, the first light transmission layer 51 has been removed in the dicing area A5, and peeling due to mechanical stress of the dicing blade can be suppressed.

Further, since there is no first light transmission layer 51 in the dicing area A5, the amount of chippings produced at dicing is small and most of them are cleaned by the cutting cleaning water.

Accordingly, attachment of the chippings produced by dicing onto the on-chip lenses in the pixel area is reduced.

As described above, attachment of the chippings to the pixel area is suppressed, peeling at the interface of the first light transmission layer is suppressed, and thereby, image quality deterioration can be suppressed and yield deterioration can be suppressed to about 0.1%.

Fourth Embodiment

Overall Configuration

Figure 11:
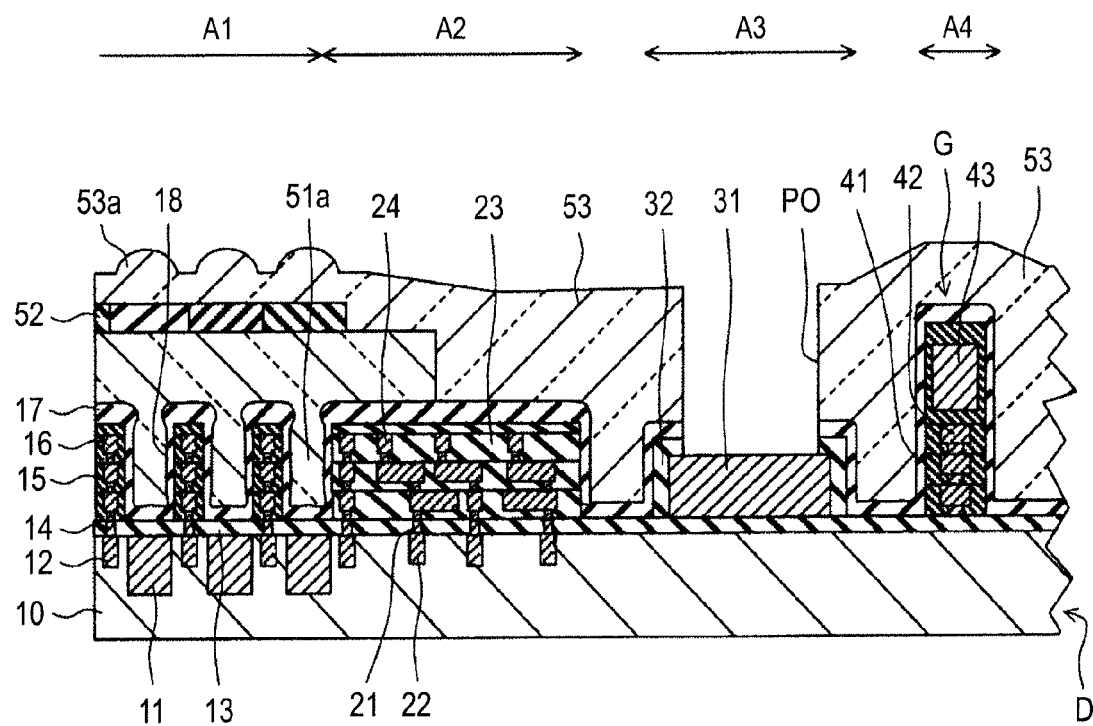
FIG. 11 is a schematic sectional view of a solid-state imaging device according to a fourth embodiment of the invention.

FIG. 11 is a schematic sectional view of a CMOS image sensor as a solid-state imaging device according to the embodiment.

In the embodiment, the first light transmission layer 51 is left only in part of the pixel area A1 and the logic area A2.

That is, the first light transmission layer 51 is removed in all of the dicing area A5.

The second light transmission layer 53 is formed in the area where the first light transmission layer 51 has been removed.

Dicing is performed to cut the second light transmission layer 53 in the area where the first light transmission layer 51 has been removed.

Except the points, the embodiment has substantially the same configuration as that of the first embodiment.

In the solid-state imaging device of the embodiment, the first light transmission layer has been removed in the whole dicing area, no crack due to the first light transmission layer occurs in the dicing, and thereby, deterioration in image quality and yield due to cracks can be reduced.

[Manufacturing Method]

A manufacturing method of a solid-state imaging device according to the embodiment will be described.

First, a configuration is formed in the same manner as that in the first embodiment to the configuration shown in FIG. 2B of the first embodiment.

Figure 12A:
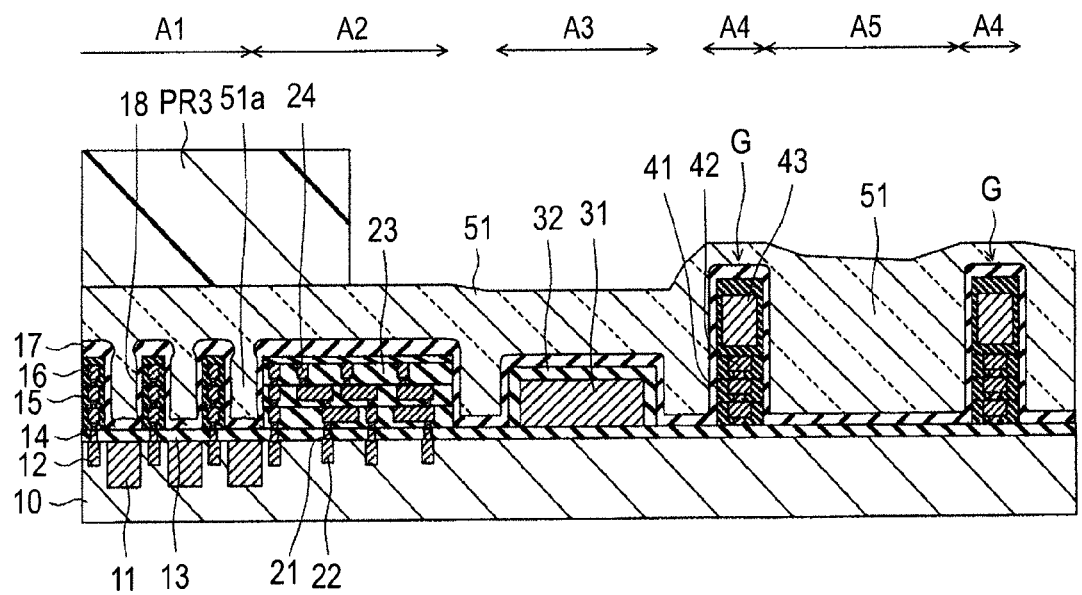
FIGS. 12A and 12B are schematic sectional views showing a manufacturing method of the solid-state imaging device according to the fourth embodiment of the invention.

Then, as shown in FIG. 12A, for example, a photoresist film PR3 is applied and exposed to light and developed to cover the part of the pixel area A1 and the logic area A2.

Figure 12B:
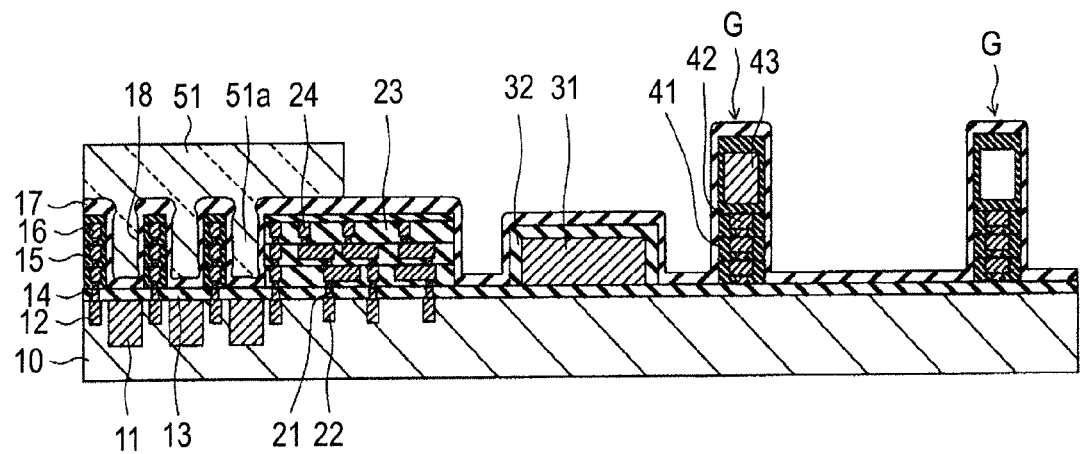

Then, as shown in FIG. 12B, for example, with the photoresist film PR3 as a mask, treatment is performed for 120 seconds at 65° C. using a 25%-tetramethylammonium hydrate (TMAH) solution.

The selection ratio of the silicon nitride to siloxane with 25%-TMAH solution is 30:1, and the loss of the silicon nitride is 40 nm at the maximum.

Thereby, the first light transmission layer 51 is selectively removed with the part of the pixel area A1 and the logic area A2 left.

Figure 13:
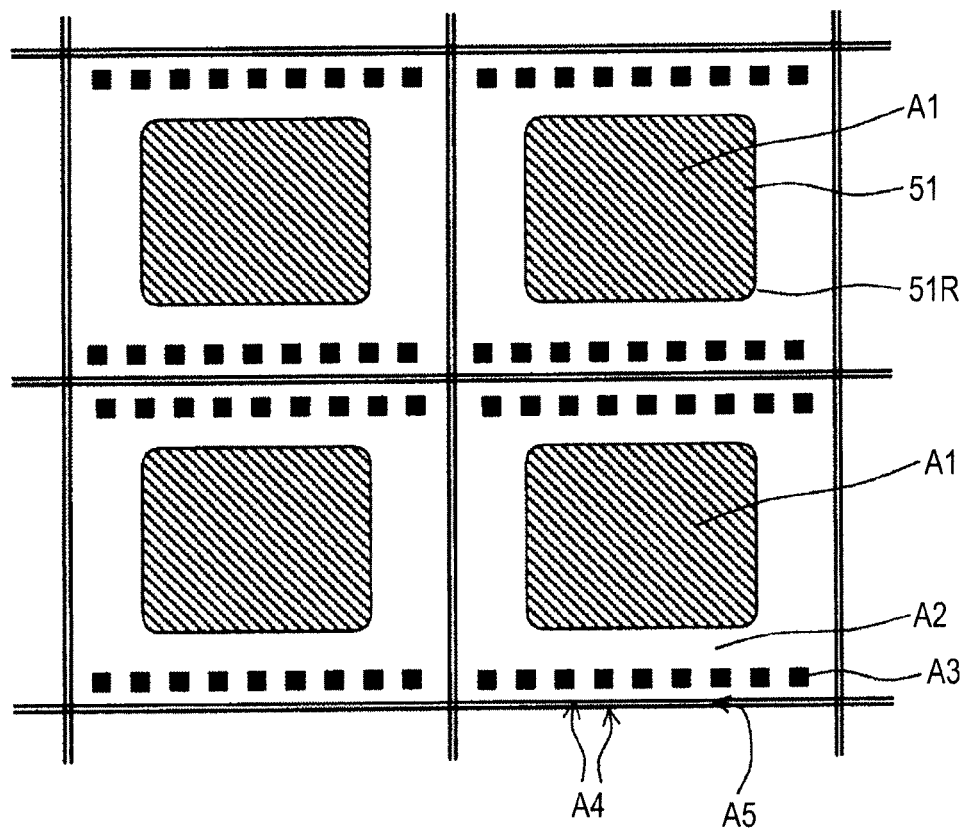
FIG. 13 is a plan view showing the manufacturing method of the solid-state imaging device according to the fourth embodiment of the invention.

FIG. 13 is a plan view of a pattern obtained as a result.

The pixel areas A1, the logic areas A2, the pad areas A3, the guard ring areas A4, and the dicing areas A5 are respectively shown.

Here, the first light transmission layer 51 is formed to cover the part of the pixel area A1 and the logic area A2.

The first light transmission layer 51 is laid out to have corner parts 51R rounded in the plan view.

For example, the radius of curvature of the corner part 51R is set to 60 μm.

After the process, in the same manner as that of the first embodiment, color filters 52 and the second light transmission layer 53 are formed.

Here, since the first light transmission layer 51 has the corner parts 51R rounded in the plan view, and variations in coating from the corners of the first light transmission layer 51 can be suppressed and prevented when the second light transmission layer 53 is formed.

Then, the configuration shown in FIG. 11 can be obtained substantially in the same manner as that of the first embodiment.

In the embodiment, the first light transmission layer 51 has been removed in the dicing area A5, and peeling due to mechanical stress of the dicing blade can be suppressed.

Further, since there is no first light transmission layer 51 in the dicing area A5, the amount of chippings produced at dicing is small and most of them are cleaned by the cutting cleaning water.

Accordingly, attachment of the chippings produced by dicing onto the on-chip lenses in the pixel area is reduced.

As described above, attachment of the chippings to the pixel area is suppressed, peeling at the interface of the first light transmission layer is suppressed, and thereby, image quality deterioration can be suppressed and yield deterioration can be suppressed to about 0.1%.

Comparative Example 1

As a comparative example, a CMOS image sensor was made as a structure formed in the same manner as that of the first embodiment to the step of forming the first light transmission layer 51 and, after the first light transmission layer 51 is formed, the surface height of the first light transmission layer 51 is not lowered by etching.

Here, the first light transmission layer exists on the guard ring G.

As a result of dicing of the structure, a crack occurring due to the mechanical stress of the dicing blade at the interface between the first light transmission layer and the second light transmission layer crossed the guard ring and some chippings reached the pad part and the logic part.

The probability that the crack progresses across the guard ring and the second light transmission layer is peeled was 4%.

Further, due to the large amount of chippings at dicing and cutting and attachment of chippings at dicing onto the on-chip lenses in the pixel area, yield was deteriorated by 3%.

In the comparative example, due to the peeling of the second light transmission layer and the attachment of chippings produced at dicing, yield was deteriorated by an average of 7%.

Comparative Example 2

The radius of curvature of the corner part shapes of the first light transmission layer other than that in the pixel area in the plan view was set to 0.11 µm.

By the manufacturing in the above described manner, at the step of forming the second light transmission layer after etching of the first light transmission layer, irregularities in application due to level difference of the first light transmission layer occurred and the yield was deteriorated.

Fifth Embodiment

Application to Electronic Equipment

Figure 14:
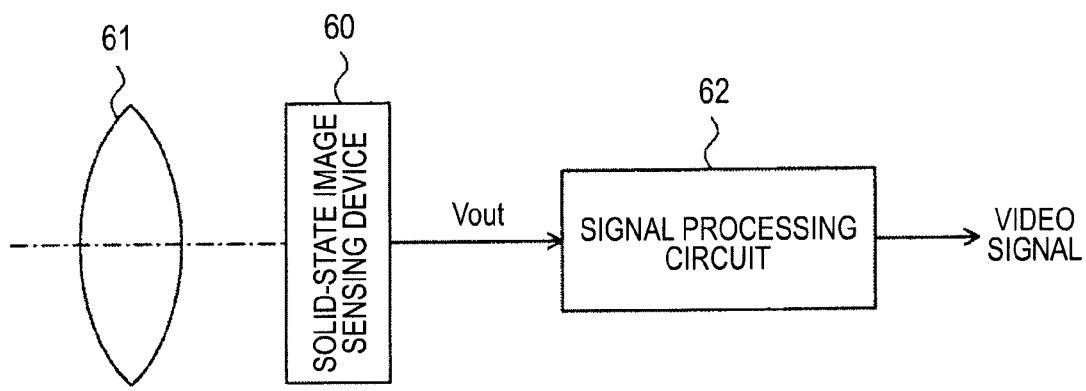
FIG. 14 is a schematic configuration diagram of electronic equipment according to a fifth embodiment of the invention.
Figure 15A:
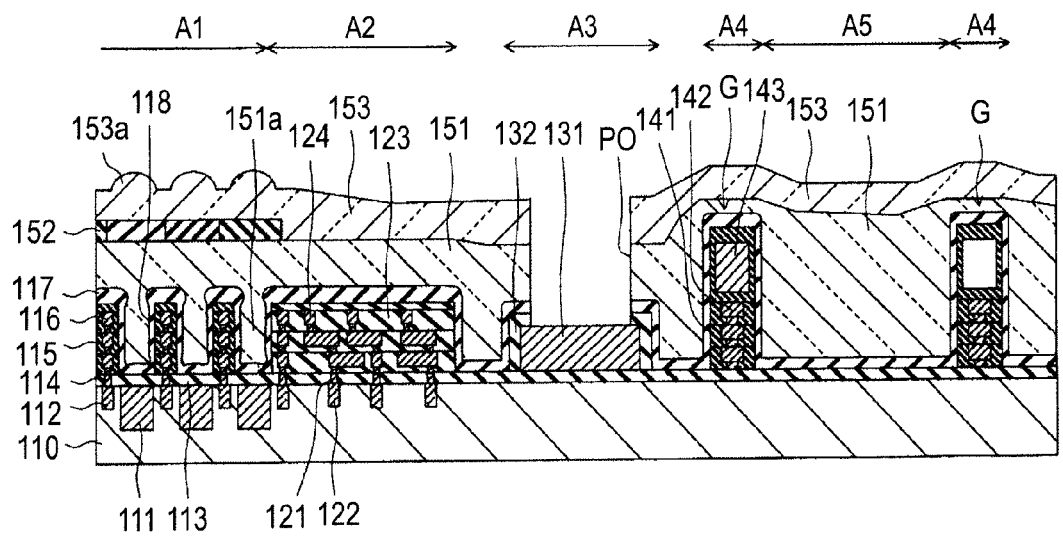
FIGS. 15A and 15B are plan views showing a manufacturing method of the solid-state imaging device according to a related art.
Figure 15B:
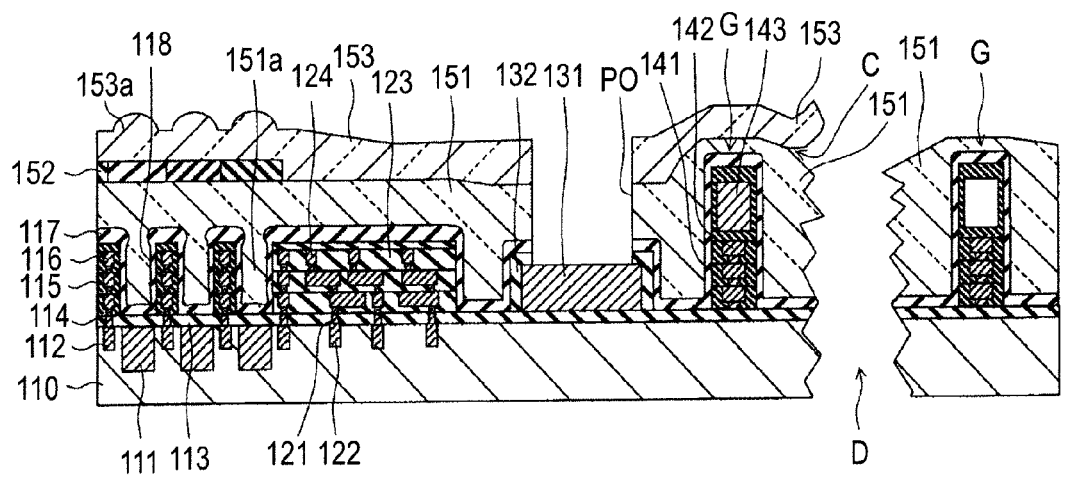

FIG. 14 is a schematic configuration diagram of a camera as electronic equipment according to the embodiment.

The camera includes a solid-state imaging device 60 in which plural pixels are integrated, an optical system 61, and a signal processing circuit 62.

In the embodiment, the solid-state imaging device 60 is formed by incorporating the solid-state imaging device according to any one of the first embodiment to the fourth embodiment.

The optical system 61 forms an image of image light (incident light) from a subject on the imaging surface of the solid-state imaging device 60.

Thereby, the light is converted into signal charge according to the amount of incident light in the photodiodes forming the respective pixels on the imaging surface of the solid-state imaging device 60, and the corresponding signal charge is accumulated in a fixed period of time.

The accumulated signal charge is taken out as output signals Vout through a CCD charge transfer path, for example.

The signal processing circuit 62 performs various kinds of signal processing on the output signals Vout of the solid-state imaging device 60 and outputs them as video signals.

According to the camera of the embodiment, color shading characteristics and spectroscopic characteristics can be improved without causing deterioration in collection ratio and sensitivity of obliquely entering light, and further, microlenses can be formed in the simple method and process.

The embodiments of the invention are not limited to those in the above description.

For example, the embodiments can be applied to either of the CMOS sensor or a CCD element.

Further, the embodiments can be applied to semiconductor devices other than the solid-state imaging device.

For example, a resin layer containing a siloxane resin is formed on a semiconductor substrate having an activated area, a guard ring that partitions the inner area including the activated area and the outer dicing area is formed to surround the outer circumference of the activated area.

Here, the resin layer is also formed near the guard ring and in the dicing area and the surface height of the resin layer is formed lower than that of the guard ring near the guard ring and in the dicing area is diced within the dicing area.

Alternatively, the resin layer is removed at least in a part of the dicing area and dicing is performed in the area where the resin layer has been removed.

The planarization layer can appropriately be applied to the other embodiments than the first embodiment.

In addition, various changes can be made without departing from the scope of the invention.

The present application contains subject matter related to that disclosed in Japanese Priority Patent Application JP 2008-314510 filed in the Japan Patent Office on Dec. 10, 2008, the entire contents of which is hereby incorporated by reference.

What is claimed is:

1. A solid-state imaging device comprising:
a photodiode formed for each pixel in a pixel area in which plural pixels are integrated on a light receiving side of a semiconductor substrate;
an insulator film formed over the semiconductor substrate to cover the photodiode;
a recessed part formed with respect to each of the pixels in the insulator film above the photodiode;
a first light transmission layer of a siloxane resin filling the recessed part and formed as an optical waveguide in the pixel area;
a second light transmission layer formed as an on-chip lens with respect to each of the pixels in the pixel area; and
a guard ring formed to surround an outer circumference of the pixel area to partition an inner area containing the pixel area and an outer dicing area,
wherein the first light transmission layer and the second light transmission layer are also formed of different materials extending to the guard ring and in the dicing area such that a top surface height of the first light transmission layer is lower than that of a highest portion of the guard ring near the guard ring and in the dicing area and an interface between the first light transmission layer and the second light transmission layer is below a top of the guard ring, the guard ring extending at least partially into the second light transmission layer, and
further wherein the first light transmission layer forming the optical waveguide covers sides of the guard ring at its base and the second light transmission layer is in direct contact with the guard ring at a top and upper sides of the guard ring and entirely covers a top surface thereof and the guard ring protrusion into the second light transmission layer provides a barrier which prevents separation of the dissimilar first and second light transmission materials from extending inward from the guard ring toward the pixel area.

2. The solid-state imaging device according to claim 1, wherein a color filter is formed at the interface between the first light transmission layer and the second light transmission layer with respect to each pixel in the pixel area.

3. The solid-state imaging device according to claim 1, wherein a planarization layer that transmits light is formed as a part of the first light transmission layer or the second light transmission layer at the interface between the first light transmission layer and the second light transmission layer in the pixel area, near the guard ring, and in the dicing area.

4. The solid-state imaging device according to claim 1, wherein the first light transmission layer has a first height in the pixel area and a second height that is greater than the first height in a region of the guard ring.

5. A method for manufacturing a solid-state imaging device comprising:
   forming a photodiode for each pixel in a pixel area in which plural pixels are integrated on a light receiving side of a semiconductor substrate;
   forming an insulator film over the semiconductor substrate to cover the photodiode;
   forming a recessed part with respect to each of the pixels in the insulator film above the photodiode;
   forming a first light transmission layer of a siloxane resin to fill the recessed part and formed as an optical waveguide in the pixel area;
   forming a second light transmission layer as an on-chip lens with respect to each of the pixels in the pixel area;
   forming a guard ring to surround an outer circumference of the pixel area to partition an inner area containing the pixel area and an outer dicing area; and
   dicing the device within the dicing area,
   wherein the first light transmission layer and the second light transmission layer are formed of different materials extending to the guard ring and in the dicing area such that a top surface height of the first light transmission layer is lower than a highest portion of the guard ring near the guard ring and in the dicing area and an interface between the first light transmission layer and the second light transmission layer is below a top of the guard ring, the guard ring extending at least partially into the second light transmission layer, and further wherein the first light transmission layer forming the optical waveguide covers sides of the guard ring at its base and the second light transmission layer is in direct contact with the guard ring at a top and upper sides of the guard ring and entirely covers a top surface thereof and the guard ring protrusion into the second light transmission layer provides a barrier which prevents separation of the dissimilar first and second light transmission materials from extending inward from the guard ring toward the pixel area.

6. The manufacturing method of a solid-state imaging device according to claim 5, further comprising the step of, after forming the first light transmission layer and before forming the second light transmission layer, removing and lowering the first light transmission layer from the surface so that a surface height of the first light transmission layer is lower than the highest portion of the guard ring.

7. A method for manufacturing a solid-state imaging device comprising:
   forming a photodiode for each pixel in a pixel area in which plural pixels are integrated on a light receiving side of a semiconductor substrate;
   forming an insulator film over the semiconductor substrate to cover the photodiode;
   forming a recessed part with respect to each of the pixels in the insulator film above the photodiode;
   forming a first light transmission layer of a siloxane resin to fill the recessed part and form an optical waveguide in the pixel area;
   forming a second light transmission layer as an on-chip lens for each of the pixels in the pixel area and wherein the first and second light transmission layers are formed of different materials;
   forming a guard ring to surround an outer circumference of the pixel area to partition an inner area containing the pixel area and an outer dicing area, the guard ring extending at least partially into the second light transmission layer; and
   dicing the device within the dicing area, wherein the step of forming the first light transmission layer includes the step of removing the first light transmission layer at least in a part of the dicing area, and, at the step of dicing, the device is diced in an area where the first light transmission layer has been removed, and further wherein the first light transmission layer forming the optical waveguide covers sides of the guard ring at its base and the second light transmission layer is in direct contact with the guard ring at a top and upper sides of the guard ring and entirely covers a top surface thereof and the guard ring protrusion into the second light transmission layer provides a barrier which prevents separation of the dissimilar first and second light transmission materials from extending inward from the guard ring toward the pixel area.

8. The manufacturing method of a solid-state imaging device according to claim 7, wherein, at the step of forming the second light transmission layer, the second light transmission layer is also formed in the area where the first light transmission layer has been removed, and
   at the step of dicing, the device is diced to cut the second light transmission layer in the area where the first light transmission layer has been removed.

9. The manufacturing method of a solid-state imaging device according to claim 7, wherein the step of forming the first light transmission layer includes the step of removing the first light transmission layer in all of the dicing area,
   at the step of forming the second light transmission layer, the second light transmission layer is also formed in the dicing area, and
   at the step of dicing, the device is diced to cut the second light transmission layer in the dicing area.

10. The manufacturing method of a solid-state imaging device according to claim 9, wherein, at the step of removing the first light transmission layer, the first light transmission layer is removed so that the first light transmission layer left may be laid out with corner parts rounded in a plan view.

11. The manufacturing method of a solid-state imaging device according to claim 7, further comprising the step of removing the first light transmission layer and the second light transmission layer at least in a part of the dicing area, after the step of forming the second light transmission layer and before the step of dicing,
   wherein, at the step of dicing, the device is diced in an area where the first light transmission layer and the second light transmission layer have been removed.

12. Electronic equipment comprising:
   a solid-state imaging device in which plural pixels are integrated on a light receiving surface side of a substrate;
   an optical system that guides incident light to an imaging part of the solid-state imaging device; and a signal processing circuit that processes an output signal of the solid-state imaging device, the solid-state imaging device including a photodiode formed at each pixel in a pixel area in which plural pixels are integrated on a light receiving surface of the substrate, an insulator film formed on the semiconductor substrate to cover the photodiode, a recessed part formed with respect to each of the pixels in the insulator film above the photodiode, a first light transmission layer of a siloxane resin formed to fill the recessed part and form an optical waveguide in the pixel area, a second light transmission layer formed as an on-chip lens for each of the pixels in the pixel area, and a guard ring formed to surround an outer circumference of the pixel area to partition an inner area containing the pixel area and an outer dicing area, wherein the first light transmission layer and the second light transmission layer are also formed of different materials extending to the guard ring and in the dicing area such that a top surface height of the first light transmission layer is lower than a highest part of the guard ring near the guard ring and in the dicing area and an interface between the first light transmission layer and the second light transmission layer is below a top of the guard ring, the guard ring extending at least partially into the second light transmission layer, and further wherein the first light transmission layer forming the optical waveguide covers sides of the guard ring at its base and the second light transmission layer is in direct contact with the guard ring at a top and upper sides of the guard ring and entirely covers a top surface thereof and the guard ring protrusion into the second light transmission layer provides a barrier which prevents separation of the dissimilar first and second light transmission materials from extending inward from the guard ring toward the pixel area.

13. A semiconductor device comprising:

a semiconductor substrate having an activated area;

a resin layer containing a siloxane resin formed over the semiconductor substrate; and a guard ring formed to surround an outer circumference of the activated area to partition an inner area containing the activated area and an outer dicing area, wherein the resin layer is also formed near the guard ring and in the dicing area such that a surface height of the resin layer is lower than a highest portion of the guard ring near the guard ring and in the dicing area, the guard ring extending at least partially into the resin layer and further wherein a light transmission layer is in direct contact with the guard ring at a top and upper sides of the guard ring and entirely covers a top surface thereof and the guard ring protrusion into the second light transmission layer provides a barrier which prevents separation of the light transmission later from extending inward from the guard ring toward the pixel area.

\* \* \* \* \*